(12) United States Patent
Sinclair

(10) Patent No.: US 7,535,241 B2
(45) Date of Patent: May 19, 2009

(54) TEST PROBE WITH HOLLOW TUBULAR CONTACT WITH BULLET-NOSED CONFIGURATION AT ONE END AND CRIMPED CONFIGURATION ON OTHER END

(75) Inventor: William Y. Sinclair, Frenchtown, NJ (US)

(73) Assignee: Aries Electronics, Inc., Bristol, PA (US)

( * ) Notice: Subject to any disclaimer, the term of this patent is extended or adjusted under 35 U.S.C. 154(b) by 99 days.

(21) Appl. No.: 11/973,956

(22) Filed: Oct. 11, 2007

(65) Prior Publication Data
US 2008/0100325 A1    May 1, 2008

Related U.S. Application Data

(60) Provisional application No. 60/855,226, filed on Oct. 30, 2006.

(51) Int. Cl.
*G01R 31/02*    (2006.01)

(52) U.S. Cl. .................................... 324/761; 324/754
(58) Field of Classification Search .................. None
See application file for complete search history.

(56) References Cited

U.S. PATENT DOCUMENTS 6,696,850 B1 * 2/2004 Sanders ..................... 324/761
6,844,749 B2 * 1/2005 Sinclair ...................... 324/761

* cited by examiner

*Primary Examiner*—Paresh Patel
(74) *Attorney, Agent, or Firm*—Anthony J. Casella; Gerald E. Hespos

(57) ABSTRACT

An electrical test probe for a connector assembly includes an elongated contact, an elongated helical coil spring, and an elongated, electrically conductive tubular member disposed about the assembly of said elongated contact and elongated helical coil spring. The bottom portion of the tubular member includes a bullet-nosed portion which protects the spring and the contact during assembly of the electrical test probe in the connector assembly.

8 Claims, 1 Drawing Sheet

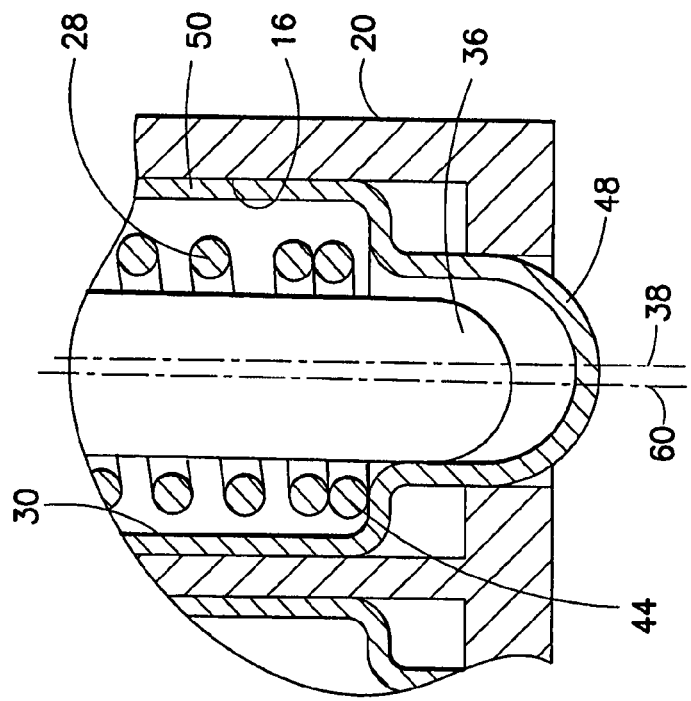
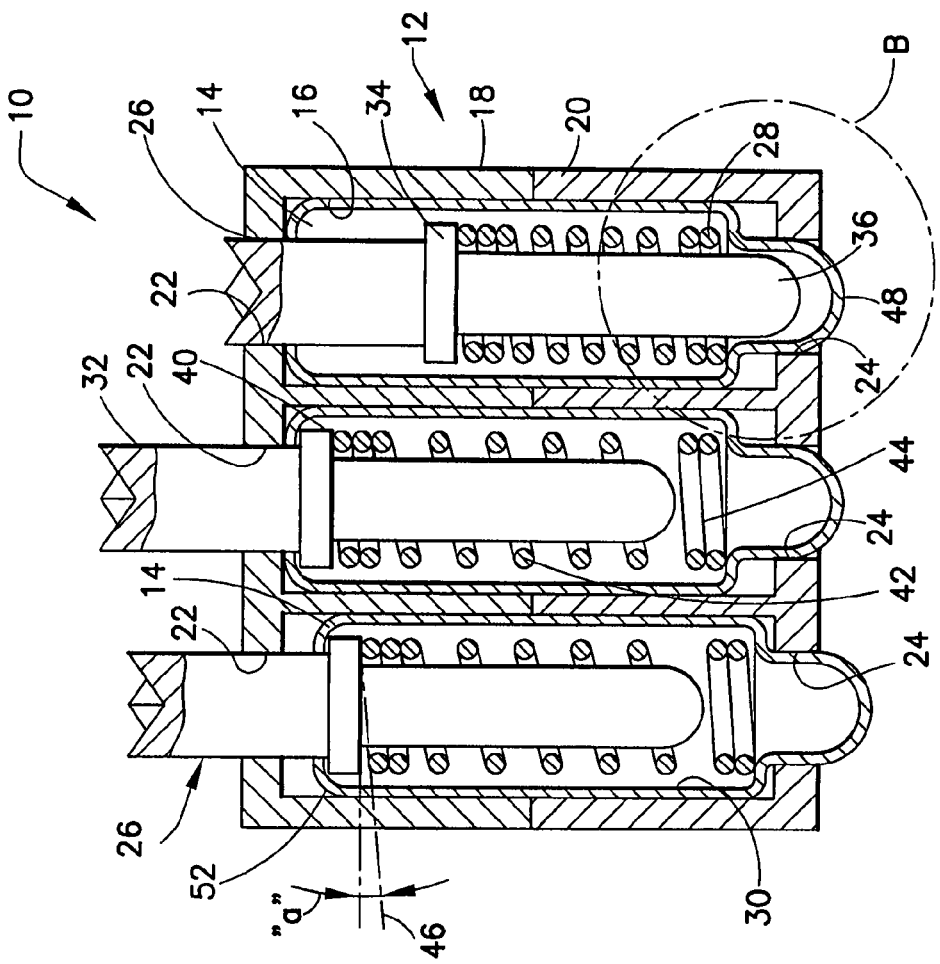

TEST PROBE WITH HOLLOW TUBULAR CONTACT WITH BULLET-NOSED CONFIGURATION AT ONE END AND CRIMPED CONFIGURATION ON OTHER END

PRIORITY

This application claims priority to an application entitled "INTEGRATED CIRCUIT TEST PROBE WITH HOLLOW TUBULAR CONTACT CONFIGURATION" filed in the United States Patent and Trademark Office on Oct. 30, 2006 and assigned Ser. No. 60/855,226, the contents of which are hereby incorporated by reference.

BACKGROUND OF THE INVENTION

1. Field of the Invention

The subject invention pertains generally to test probes and, more specifically, to a new and improved integrated circuit ("IC") test probe for use in various testing applications. Furthermore, the subject invention is capable of being employed in several different configurations that permit it to be used with a wide variety of IC chips.

An integrated circuit component must be tested and evaluated for reliability before actual use. For proper evaluation and testing, the IC must be electrically connected to a printed circuit board ("PCB") by a reliable means. As the microelectronic field has advanced, the complexity and concentration of components in an IC has increased dramatically. This increase has led to an increased lead density of the IC chip with a corresponding decrease in the gap between the leads. As a result, there is a need for smaller sized test probes to accommodate these increasingly complex ICs.

It should also be noted that ball grid array ("BGA") and land grid array ("LGA") packages have become increasingly popular because of their high densities and low profiles. With a BGA package, the rounded solder balls of the BGA are usually soldered directly to a corresponding surface mount pad of a printed circuit board, rather than the pins of a pin grid array IC package.

2. Description of the Related Art

Applicant's U.S. Pat. No. 6,844,749 entitled "Integrated Circuit Test Probe" which issued on Jan. 18, 2005 and is assigned to the same assignee of the subject invention provides a new and improved test probe small enough to accommodate the increased density of leads on modern IC chips. U.S. Pat. No. 6,844,749 also provides a test probe that has durable and flexible contacts for connecting a component to a PCB. Still further, applicant's prior patent provides a test probe that is capable of accepting ball grid array ("BGA") or land grid array ("LGA") chips.

Although the integrated circuit test probe of applicant's U.S. Pat. No. 6,844,749 fulfills a need for connecting a plurality of leads on modern IC chips, it has been found that certain customers mishandle the test probe of said patent.

More particularly, U.S. Pat. No. 6,844,749 discloses a test probe consisting of an elongated screw machine contact biased by a helical spring and mounted in a through hole of a non-conductive substrate. One end of the contact includes a crown for engaging a solder ball lead of an IC package, and the contact includes an intermediate collar which maintains the contact within the through hole. The helical spring is disposed about the contact, with one end thereof engaging the lower end of the collar. The other end of the helical spring has contiguous coils and is of a reduced diameter so as to extend beyond the lower end surface of the non-conductive substrate to make electrical contact with a printed circuit board. When the test probe of U.S. Pat. No. 6,844,749 is compressed between an IC package and a printed circuit board, the inherent twisting of the helical spring causes the contact to tilt and make electrical contact with the contiguous coils, thereby establishing a direct electrical path between the IC package and the printed circuit board, with minimum resistance and minimum inductance. The disclosure of U.S. Pat. No. 6,844,749 is incorporated by reference in this application in its entirety.

The contiguous coils of the helical spring which extend beyond the lower end of the non-conductive substrate to make electrical contact with a printed circuit board are exposed and subject to mishandling or twisting by the operator during mounting of the integrated circuit test probe in a fixture. The contiguous coil ends of the helical spring are of very small diameter and cannot readily absorb any unintended force, whereby one or several helical springs may be twisted so as to render the integrated test probe inoperative.

It is an object of the subject invention to provide an improved integrated circuit test probe of the type disclosed in U.S. Pat. No. 6,844,749, but with an arrangement wherein the lower end of the contact is not subjected to damage should an inadvertent force be applied to the lower ends of the contact.

SUMMARY OF THE INVENTION

The subject invention provides an improved test probe for connecting an IC chip to a printed circuit board and, more particularly, an improved integrated test probe of the type disclosed in U.S. Pat. No. 6,844,749. The subject invention further provides for a new and improved test probe that is small enough to be used in the densities required by state-of-the-art integrated circuit chips. The test probe of the subject invention maintains high electrical connectivity, while at the same time maintaining a low insertion force parameter so as to extend the life of the test probe and to minimize damage to the leads of the IC chips under tests. Furthermore, the subject invention provides a test probe wherein the probe portions which initially extend out of the substrate are structurally sound and not subject to damage due to an inadvertent force applied to the lower ends of the contacts.

The connector assembly of the subject invention includes a non-conductive substrate having a plurality of annular through holes extending between the top and bottom surfaces thereof. Each through hole has an enlarged diameter portion intermediate the top and bottom surfaces, and a corresponding plurality of resilient electrical probes are disposed in the through holes. Each probe is formed from an elongated contact, a helical spring, and a tubular member made of thin-walled, electrically conductive material which houses the electrical contact and the helical spring.

The elongated contact has an intermediate, enlarged diameter collar portion which is located in the tubular member within the enlarged diameter portion of the through hole, with a first end of the elongated contact extending beyond the top surface of the substrate and preferably including a crown portion for engaging the IC lead, for example, a BGA lead.

The elongated helical spring of the electrical probe of the subject invention is disposed about the elongated contact and within the tubular member. The helical spring has an upper portion, an intermediate portion, and a lower portion. The upper portion of the spring bears against the lower side of the enlarged diameter collar portion of the electrical contact. As is inherent in any helical spring, the plane of the top surface of the upper portion of the helical spring is inclined relative to the plane of the bottom of the collar. Stated differently, the plane of the top portion of the spring is not orthogonal to the longitudinal axis of the through hole. The upper portion of the spring is not flush with the bottom surface of the collar, and only a portion of the spring bears against the collar. This particular physical characteristic of the subject contact is extremely important in the operation of the subject contact assembly, as will be detailed hereinafter.

The intermediate portion of the spring is wholly disposed within the through hole and is of greater diameter than the diameter of the second end of the elongated contact. The electrical contact and the helical spring are disposed within the tubular member forming a portion of the probe. The lower portion of the tubular member is closed with a bullet-nosed configuration of smaller diameter than the portion of the tubular member disposed in the through hole. The bullet-nosed portion of the tubular member extends through and beyond the small diameter hole of the through hole disposed at the lower surface of the substrate of the connector assembly. More particularly, the bullet-nosed portion of the tubular member extends below the lower surface of the non-conductive substrate.

The upper portion of the tubular member is crimped radially inwardly to form a restricted opening. The upper portion of the elongated contact extends through the restricted opening of the tubular member, and the intermediate enlarged diameter collar of the electrical contact is restrained within the tubular member by the pressure of the helical spring bearing against the enlarged diameter collar which, in turn, bears against the restrictive opening of the tubular member.

The lower spring portion of the helical spring is tightly wound such that the coils are contiguous, with the diameter of the lower spring portion being of greater diameter than the diameter of the bullet-nosed lower portion of the tubular member. Accordingly, the lower portion of the elongated contact extends through the contiguous coil portion of the lower spring and into the bullet-nosed portion of the tubular member.

The bullet-nosed portion of the tubular member is designed to be of structural integrity such that an inadvertent force applied to the bullet-nosed section of the test probe will not cause any damage to the spring or contact of the electrical connector assembly.

During a testing operation, a pad of the printed circuit board is brought into contact with the bullet-nosed portion of the tubular member so as to make electrical contact and to partially compress the helical spring of the test probe. Next, an integrated circuit package is pressed against the connector assembly, with each solder ball being engaged by the crown of the elongated contact. As the spring is compressed, because of the inclination of the top plane of each spring relative to the bottom of the enlarged diameter collar of the contact, each elongated contact is tilted such that the longitudinal axis of the contact is at an acute angle relative to the longitudinal axis of the through hole. At such time, the lower end of the elongated contact makes electrical contact with the inner wall of the bullet-nosed portion of the tubular member thereby establishing a direct electrical path from the solder ball through the entire length of the contact, through the tubular member and to the pad on the printed circuit board.

The subject invention establishes electrical contact between an IC package and a printed circuit board with a minimum of resistance and inductance, and in a manner to enable its use in high frequency applications. Furthermore, the subject invention provides a structurally superior electrical probe which is able to withstand inadvertent forces which would otherwise damage the lower ends of the springs and contacts during assembly of the subject connector in the test apparatus.

DETAILED DESCRIPTION OF THE DRAWINGS

FIG. 1 is a cross-sectional view of the electrical connector of the subject invention, showing, from left to right, the test probe in the initial rest position, the lower portion of the test probe being engaged to a printed circuit board, and on the far right, the final position of the subject invention wherein electrical contact is established between an integrated IC package and a printed circuit board.

FIG. 2 is an enlarged view of section B of FIG. 1 illustrating the electrical contact between the elongated contact and the bullet-nosed section of the thin-walled tubular member.

DETAILED DESCRIPTION OF THE PREFERRED EMBODIMENT

Referring to FIG. 1, a new and improved connector assembly 10 is provided for connecting an IC package to a printed circuit board. The connector 10 includes a non-conductive substrate 12 with a plurality of electrical probes 14 mounted in through holes 16 formed through the substrate 12. The number of the electrical probes 14 will generally correspond to the number of lands provided with the IC package. Also, the size of the connector 10 is generally dependent on the size of the IC package. For purposes of illustration, the connector 10 of the subject invention is shown and described in connection with a ball grid array (BGA) package to a chip scale package (CSP) burn-in socket.

It should be noted that the connector 10 need not be formed with the same dimensions as the IC package for purposes of this invention. However, the electrical probes 14 must be disposed in the connector 10 such that the pressing contact is achieved between the electrical probes 14 and the balls of the integrated circuit, with the connector being placed in face-to-face contact with the integrated circuit.

The solder balls may be disposed to define a plurality of rows and columns throughout the surface of the integrated circuit. Consequently, although not shown, the electrical probes 14 are to be aligned in a similar row-column pattern.

The non-conductive substrate 12 is preferably formed of two layers 18, 20 which are bonded together and which define the through holes 16. Each through hole 16 includes an intermediate portion which is of uniform annular diameter, and each through hole 16 has a restricted upper opening 22 and a restricted lower opening 24 of reduced diameter. As illustrated in FIG. 2, the longitudinal axis of through hole 16 is designated by the numeral 38.

Each electrical probe 14 includes a screw machine elongated electrical contact 26, a helical spring 28, and a tubular member 30 which is made of thin-walled, electrically conductive material.

The elongated contact 26 includes at its upper or first end a crown portion 32 for engaging a solder lead, an intermediate collar 34, and a lower or second end 36. The collar 34 is of slightly smaller diameter than the enlarged diameter portion of the through hole 16 and is disposed within the through hole 16 and confined within the through hole 16 by the restricted opening 22.

The crown portion 32 projects above the top layer 18 of the non-conductive substrate 12, while the portion of the contact 26 disposed below the collar 34 including the second end 36 is wholly disposed within the non-conductive substrate 12.

The spring 28 is generally cylindrically shaped and is formed from material having good spring characteristics, such as beryllium copper, which permits resilient contraction of the spring 28 relative to the substrate 12. The generally cylindrical resilient spring 28 is formed from a single unitary conductor which is coiled in a helical fashion. Spring 28 includes an upper portion 40, an intermediate portion 42 and a lower portion 44.

The upper portion 40 of spring 28 is formed of coils which are contiguous and which are of a diameter generally corresponding to the diameter of the collar 34. The upper coil of the upper portion 40 of the spring 28 bears against the lower surface of the collar 34.

Because of the inherent characteristics of helical coil springs, the plane 46 of the top of the upper portion 40 of spring 28 is disposed at an acute angle "a" to the generally horizontal plane of the lower portion of the collar 34. As a result, only a portion of the upper spring portion 40 is initially in contact with the collar 34.

The intermediate coil portion 42 of the spring 28 is of open pitch configuration so as to be capable of being longitudinally compressed under the action of opposing forces. As shown in FIG. 1, the diameter of the intermediate portion 42 of the spring 28 is less than the inner diameter of the through hole 16.

The lower portion 44 of spring 28 also has coils which are contiguous.

As shown in FIG. 1, both the electrical contact 26 and the spring 28 are housed within tubular member 30. Tubular member 30 includes a bullet-shaped lower portion 48, an intermediate cylindrical portion 50 and an upper portion 52 which is radially crimped inwardly to define a restrictive opening for the passage therethrough of the crown portion 32 of the elongated contact 26.

The bullet-nosed lower portion 48 of the tubular member 30 is of a diameter so as to project through the restricted lower opening 24 of the substrate 12 and to be axially movable therein under the action of spring 28. The bullet-nosed lower portion 48 of each tubular member 30 is closed and defines a structurally sturdy portion of the electrical probes 14 of the connector assembly 10 which will not readily be damaged during the assembly of the connector assembly in a test jig and connection to a PCB.

The intermediate cylindrical portion 50 of the tubular member 30 is slightly less in diameter than the diameter of the through hole 16 so as to enable the elongated contact 26 to move both vertically and at an angle relative to the longitudinal axis 38 during operation of the connector assembly.

The upper restricted opening 52 of the tubular member 30 includes the radially inwardly crimped portion so as to restrict the upper end 32 of the electrical connector in its vertically upward movement.

In the left-most illustration of the probe 14 in FIG. 1, the probe is in the initial rest condition, at which time the spring 28 is extended so as to force the upper crown portion 32 of the elongated contact 26 beyond the upper surface of the connector assembly. At the same time, the spring 28 is extended and bears against the lower surface of the intermediate collar 34 and forces the bullet-nosed lower portion 48 of the tubular member 30 through the lower restricted opening 24 and beyond the lower plane of the substrate 12.

In the middle illustration of FIG. 1, the bullet-nosed portion 48 of the tubular member 30 is in contact with a printed circuit board (not shown), so as to force the tubular member 30 vertically upwardly thereby compressing the spring 28, and causing the tubular member 30 to be forced up against the inside surface of the upper restricted opening 22 of the substrate 12.

In the right-most illustration of the electrical probe 14 in FIG. 1, the crown portion 32 of the elongated contact 26 has been contacted by a solder ball (not shown), and forced vertically downwardly so that the top portion of the crown portion 32 is substantially flush with the upper surface of the substrate 12.

Reference is now made to FIG. 2 which is an enlargement of the Section B in FIG. 1 and which illustrates the condition of an electrical probe 14 as it is nested between a printed circuit board and a BGA. At such time, in a manner similar to the operation of the connector assembly in applicant's U.S. Pat. No. 6,844,749, as the elongated contact 26 is moved downwardly into the non-conductive substrate 12, the intermediate collar 34 bears against the upper spring portion 40 and, because of the inclined plane 46 of the upper spring portion 40, the elongated contact 26 is forced to rotate or tilt, such that the longitudinal axis 60 of the contact 26 is at an acute angle to the longitudinal axis 38 of the through hole 16.

In the position as illustrated in FIG. 2, the lower end 36 of the elongated contact 26 makes electrical contact with the bullet-nosed portion 48 of the tubular member 30, thereby providing a direct electrical path from the BGA, through the length of the elongated contact 26, and through the bullet-nosed portion 48 of the tubular member 30 to the printed circuit board.

As is readily apparent, numerous modifications and changes may readily occur to those skilled in the art, and hence it is not desired to limit the invention to the exact construction and operation shown and described. Accordingly, all suitable modification equivalents may be resorted to as falling with the spirit and scope of the invention as claimed.

What is claimed is:

1. An electrical test probe for a connector assembly comprising:
    an elongated contact having an intermediate collar;
    an elongated helical coil spring disposed about said contact, with one end of the spring bearing against one side of said intermediate collar such that the plane of the spring is at an acute angle to said one side of the collar, and wherein the opposite end of the spring includes contiguous spring coils, the diameter of said contiguous spring coils at said opposite end of the helical coil spring being of smaller diameter than the diameter of the coils at said one end of the spring; and
    an elongated, electrically conductive tubular member disposed about the assembly of said elongated contact and the elongated helical coil spring, one end of said tubular member being open and crimped about the other side of the intermediate collar of the elongated contact, with the opposite end of said tubular member being closed and of bullet-nosed configuration, the bullet-nosed portion of said tubular member being of smaller diameter than the portion of said tubular member containing the elongated contact and the elongated helical coil spring whereby, in operation, when the electrical probe is compressed between a printed circuit board and an integrated circuit, the longitudinal axis of the elongated contact is skewed to establish a direct electrical path between the contact and the bullet-nosed portion of said tubular member.

2. An electrical test probe as in claim 1 wherein the elongated contact has at one end thereof a crown configuration for engaging the solder ball of a BGA integrated circuit, with the opposite end of said elongated contact extending through the contiguous spring coils of the helical coil spring and into the bullet-nosed portion of said tubular member.

3. An electrical test probe for a connector assembly as in claim 1 wherein the intermediate portion of the elongated helical coil spring is of constant pitch.

4. An electrical test probe for a connector assembly as in claim 1 wherein the helical coil spring is made of beryllium copper.

5. An electrical test probe for a connector assembly as in claim 1 wherein the connector assembly includes a non-conductive substrate having opposed top and bottom surfaces and a plurality of annular through holes extending between said top and bottom surfaces, each said through hole having an enlarged diameter portion intermediate said top and bottom surfaces; and a plurality of electrical test probes corresponding to said plurality of through holes, with each test probe being disposed within a through hole and wherein the bullet-nosed portion of each said tubular member extends through a hole in the bottom surface of said connector assembly and is slidably movable therein.

6. A connector assembly for forming a plurality of electrical connections between an integrated circuit package and a printed circuit board, said connector assembly comprising:

a non-conductive substrate having opposed top and bottom surfaces, and a plurality of annular through holes extending between said top and bottom surfaces, each said through hole having an enlarged diameter portion intermediate said top and bottom surfaces;

a plurality of resilient electrical probes corresponding to said plurality of through holes, each said electrical probe being formed from an elongated contact, a helical spring, and an elongated, electrically conductive tubular member;

said elongated contact having an intermediate enlarged diameter collar portion disposed within said enlarged diameter portion of said through hole, with a first end of said elongated contact extending beyond the top surface of said substrate, while the second end of said elongated contact is disposed within said through hole and is of smaller diameter than said collar portion thereof;

said elongated helical spring being disposed about said elongated contact and having an upper portion, an intermediate portion, and a lower portion, said upper spring portion bearing against one side of said enlarged diameter collar and being tightly wound such that the coils thereof are contiguous, said intermediate spring portion being wholly disposed within said through hole and being of a diameter greater than the diameter of said second end of the elongated contact, and said lower spring portion being also tightly wound such that the coils are contiguous;

said elongated, electrically conductive tubular member being thin walled and disposed about the assembly of said elongated contact and the helical coil spring, one end of said tubular member being open and crimped about the other side of the intermediate collar of the elongated contact, with the opposite end of said tubular member being closed and of bullet-nosed configuration, the bullet-nosed portion of said tubular member being of smaller diameter than the portion of said tubular member containing the elongated contact and the coil spring, said bullet-nosed portion being of a diameter smaller than the through hole at the bottom surface of the substrate so as to extend beyond said bottom surface for connection to a printed circuit board whereby, in the operative position of the electrical probe, the collar of said elongated contact bears against the upper portion of said elongated helical spring resulting in tilting of said elongated contact such that the second end thereof makes electrical contact with the bullet-nosed portion of the tubular member such that a direct electrical path is established between the contact and the bullet-nosed portion of the tubular member.

7. A connector assembly for forming a plurality of electrical connections between an integrated circuit package and a printed circuit board as in claim 6 wherein said helical spring is made of beryllium copper.

8. A connector assembly for establishing a plurality of electrical connections between an integrated circuit package and a printed circuit board as in claim 6 wherein said first end of the elongated contact is formed with a crown configuration for engagement with a solder ball of a BGA integrated circuit package.

* * * * *